United States Patent [19]

Norris et al.

[11] Patent Number: 4,827,497
[45] Date of Patent: May 2, 1989

[54] ELECTRONIC TRIGGER SWITCH FOR MAINTENANCE TERMINATION UNIT

[75] Inventors: Richard G. Norris, Arlington; Monty F. Webb, Richardson; Vinh Q. Le, Arlington, all of Tex.

[73] Assignee: Teccor Electronics, Inc., Irving, Tex.

[21] Appl. No.: 224,201

[22] Filed: Jul. 21, 1988

Related U.S. Application Data

[63] Continuation of Ser. No. 23,434, Mar. 9, 1987, abandoned, which is a continuation-in-part of Ser. No. 801,758, Nov. 26, 1985, Pat. No. 4,685,120.

[51] Int. Cl.[4] .............................................. H04B 3/46
[52] U.S. Cl. ........................................ 379/26; 307/256
[58] Field of Search ............................ 379/26, 22, 29; 307/256; 357/76, 75

[56] References Cited

U.S. PATENT DOCUMENTS 4,373,121 2/1983 Sartori et al. ........................ 379/26
4,396,809 8/1983 Brunssen ............................. 379/26

Primary Examiner—Stafford D. Schreyer
Attorney, Agent, or Firm—Richards, Harris, Medlock & Andrews

[57] ABSTRACT

A telephone maintenance termination unit utilizes a low voltage, bidirectional trigger switch for performing diagnostic functions on a telephone line. The trigger switch provides low voltage, low current triggering in conjunction with a high holding current requirement. The trigger switch may comprise either two silicon controlled rectifiers connected in inverse parallel relationship with their gates connected, a bidirectional diffused PNPN semiconductor device, or an NPN semiconductor device, any one of which is used to trigger a power control TRIAC. In another embodiment, the switching device may be a two-terminal, unitary semiconductor device incorporating the functions of both the TRIAC and the bidirectional trigger switch.

6 Claims, 3 Drawing Sheets

ELECTRONIC TRIGGER SWITCH FOR MAINTENANCE TERMINATION UNIT

This application is a continuation of application Ser. No. 023,434 filed Mar. 9, 1987 abandoned which is a continuation-in-part of application Ser. No. 801,758 filed Nov. 26, 1985, now U.S. Pat. No. 4,685,120 issued on Aug. 4, 1987.

TECHNICAL FIELD

This invention relates to electronic devices used to trigger thyristors, and in particular to electronic trigger switches used in telephone maintenance termination units.

BACKGROUND OF THE INVENTION

The thyristor family of semiconductor devices consists of several very useful devices, including silicon controlled rectifiers (SCRs), DIACS, and TRIACS. Thyristors are characterized by having two states, an on-state and an off-state, making them useful for electric power regulation, switching, and phase control.

An SCR is a unidirectional PNPN semiconductor device having an anode, a cathode, and a gate. In the off-state, an SCR is a high-resistance, low-current circuit element at voltages up to its breakover voltage. A momentary positive pulse applied to the gate of an SCR will bias the device so that it switches to the on-state and becomes a low-resistance, high-current element. Once an SCR is in the on-state, it will remain in the on-state until the principal anode to cathode current drops below the holding current of the device.

A TRIAC is a bidirectional thyristor which functions to control power in an AC electric circuit. The operation of a TRIAC can be related to two SCRs connected in inverse parallel. A TRIAC has a single gate, and the device can be triggered to the on-state by a gate pulse of either polarity. A TRIAC operates in a circuit in both directions essentially the same as an SCR behaves in its forward direction.

A DIAC is essentially an open base NPN transistor. A DIAC functions as a bidirectional circuit element which exhibits a high impedance state at voltages up to its voltage breakover point. Above the voltage breakover point a DIAC enters its on-state region, where current flows through the device as it exhibits decreasing resisitivity. Because of these characteristics, a DIAC can be used in a resistor-capacitor AC circuit to produce a bidirectional pulsing oscillator. In addition, a DIAC is an economical bidirectional device for triggering TRIACs in phase control circuits.

In many electrical applications it is desirable to have a power control circuit having a low voltage, low current triggering response with a relatively high holding current requirement. The high holding current can be provided by a TRIAC, but a standard DIAC does not provide the desired triggering characteristics for a TRIAC in such an application. This is because a standard DIAC has a higher voltage requirement and does not switch on completely at the breakover point. To achieve low voltage triggering capability for TRIACs, it has been necessary to construct relatively complicated triggering circuits comprising a plurality of transistors, resistors, and diodes in a bridge network. Such circuits have been simplified only to a limited extent by placing two integrated circuits on a chip to produce a silicon bilateral switch (SBS) such as the General Electric type 2N4991.

Because of the complexity of the prior art TRIAC triggering circuits, it is desirable to provide a simplified, economical, bidirectional, low voltage trigger device which switches on fully when the trigger voltage is reached.

A specific application which requires a low voltage trigger switch for a TRIAC is the maintenance termination unit (MTU) of a telephone line. The MTU is a diagnostic circuit placed at the subscriber's terminal of a telephone line and used for analyzing faults and maintaining the line. An MTU provided by the Western Electric Company utilizes a complicated trigger circuit to provide the specific low voltage switching capability necessary for the desired MTU response characteristics. An additional line testing device is described in U.S. Pat. No. 4,169,220 issued to Gary Fields on Sept. 25, 1979 and entitled "Telephone Instrument Connection block with Remotely Actuated Line Test". Because of the very large number of MTUs required to update telephone systems around the country, it is highly desirable to provide a simple, economical trigger switch to replace the complicated circuitry now used as a bidirectional, low voltage switch for the TRIAC in the MTU.

SUMMARY OF THE INVENTION

The present invention comprises a telephone maintenance termination unit (MTU) having a low voltage, bidirectional trigger switch as a component. An MTU is a diagnostic circuit which is permanently installed at the subscriber's terminal of a telephone line. An MTU is utilized by the telephone company to analyze faults and perform maintenance on the line. The MTU currently provided by the Western Electric Company utilizes a complicated trigger circuit containing a multiplicity of elements to provide the specific low voltage switching performance necessary for the proper MTU response characteristics.

The MTU of the present invention contains a trigger switch which replaces the complex trigger circuitry of existing devices with a much simpler and more economical device. A major element of the previously existing MTU devices is a TRIAC, which must be switched to the on-state by a trigger circuit or device which functions at a very low current level and within a narrow, specific low voltage range.

The MTU of the present invention utilizes a bidirectional trigger switch of several different embodiments, all of which are simpler, less costly, and easier to fabricate and install than the currently used trigger circuits. One embodiment of the invention comprises two sensitive gate silicon controlled rectifiers (SCRs) connected in inverse parallel relationship, such that the anode of one is connected to the cathode of the other and the gates are connected directly to each other. The result is a bidirectional trigger switch which provides a trigger to switch the TRIAC to its on-state at a specific and well defined low voltage level.

In a second embodiment of the invention, the electronic trigger switch of the MTU is a silicon trigger switch (STS). The STS is a diffused semiconductor device having an anode at one end, a cathode at the other end, and an electrical behavior similar to two sensitive gate SCRs connected in inverse parallel relationship. In a third embodiment of the invention, the bidirectional electronic trigger switch is replaced by a DIAC having specialized, low voltage breakover characteristics. In a fourth embodiment, the electronic trigger switch comprises a silicon bilateral switch (SBS) similar to the General Electric type 2N4991, but having specialized, low voltage breakover characteristics.

Further embodiments of the invention provide an MTU without a TRIAC. One such embodiment replaces the TRIAC and trigger circuitry of the MTU with two non-sensitive SCRs connected in inverse parallel with their gate terminals joined using an STS such as described above. Another embodiment of the invention combines the TRIAC of the MTU and its associated trigger circuitry into a single semiconductor device such as a SIDAC or a large scale STS capable of accommodating power surges of up to 30 amperes full cycle surge or 100 amperes sub-cycle surge.

BRIEF DESCRIPTION OF THE DRAWINGS

For a more complete understanding of the present invention and the advantages thereof, reference is now made to the following Description of the Preferred Embodiments taken in conjunction with the accompanying Drawings, in which.

DESCRIPTION OF THE PREFERRED EMBODIMENTS

Figure 1:
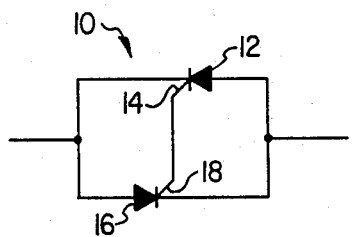
FIG. 1 is a schematic diagram of two sensitive gate silicon controlled rectifiers connected in inverse parallel relationship to form the electronic trigger switch used with the present invention.

Referring to FIG. 1, an embodiment of the electronic trigger switch 10 of the present invention is illustrated schematically in a circuit diagram. Trigger switch 10 comprises sensitive gate silicon controlled rectifier (SCR) 12 and sensitive gate SCR 16. Sensitive gate SCRs, such as the EC103 series of SCRs manufactured by Teccor Electronics, Inc., have very high gate impedence but require very low gate current, on the order of 12 to 500 microamperes, to trigger the SCRs to the conductive on-state. Trigger switch 10 is constructed by connecting the anode of SCR 12 to the cathode of SCR 16 and the anode of SCR 16 to the cathode of SCR 12. To complete the connection, the gate electrode 14 of SCR 12 is connected directly to the gate electrode 18 of SCR 16. The resulting circuit produces trigger switch 10, which is a two-terminal, bidirectional device.

Figure 2:
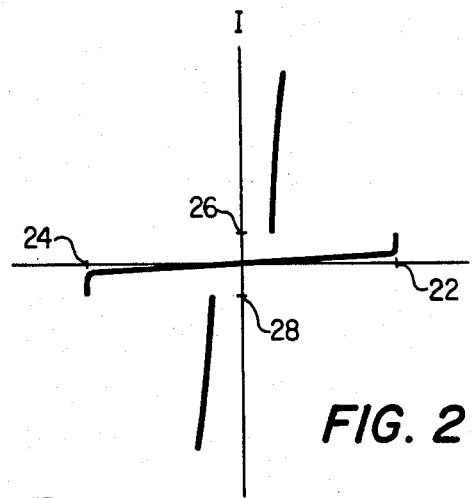
FIG. 2 is a voltage-current characteristic curve of the trigger switch of FIG. 1.

The voltage-current response curve of trigger switch 10 is illustrated in FIG. 2. The connection of identical sensitive gate SCRs in the inverse parallel configuration of FIG. 1 produces the symmetrical, bilateral response curve shown in FIG. 2. When voltage is applied to the terminals of trigger switch 10, current is initially blocked because the forward-biased SCR is in the off-state and the other SCR is reverse-biased. As the voltage increases, the voltage reaches the gate peak inverse voltage (PIV) of the reverse-biased SCR and current begins to flow out from the gate of the reverse-biased SCR. The current flowing out of the gate of the reverse-biased SCR enters the gate of the forward-biased SCR and switches the forward-biased SCR to the on-state, allowing principal current to flow through the forward-biased SCR and thus through trigger switch 10. The voltage-current curve of FIG. 2 shows the bidirectional behavior of trigger switch 10 by illustrating the symmetrical response as trigger switch 10 is biased in opposite directions. It can be seen that the gate to cathode Peak Inverse Voltage (PIV) of the reverse-biased SCR corresponds to the breakover voltage 22, 24 of the trigger switch 10, which is about 16 to 19 volts. Once the forward-biased SCR is switched to the on-state, the trigger switch 10 will remain in the conductive state as long as the principal current exceeds the minimum holding current 26, 28 of the forward-biased SCR.

Figure 3:
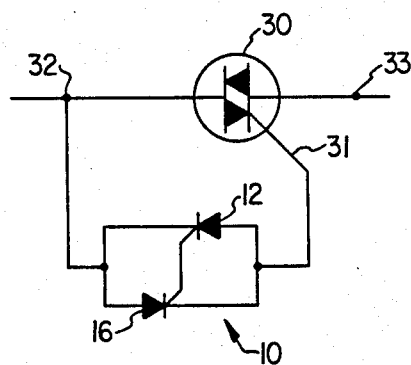
FIG. 3 is a schematic diagram of the trigger switch of FIG. 1 used as a trigger for a TRIAC.

An important application for trigger switch 10 is illustrated by the schematic diagram of FIG. 3. Trigger switch 10 is shown connected to the gate 31 of TRIAC 30 to act as a trigger for TRIAC 30. A TRIAC, such as logic TRIAC L201E7 manufactured by Teccor Electronics, Inc., is a power control device which requires a gate trigger current of about 3 to 25 milliamperes of either polarity to switch the TRIAC to the on-state. The use of trigger switch 10 in conjunction with TRIAC 30, as shown in FIG. 3, produces a circuit, having terminals 32 and 33, that has the characteristics of a low switching current, a high holding current, and a specific low voltage breakover point of either polarity.

Figure 4:
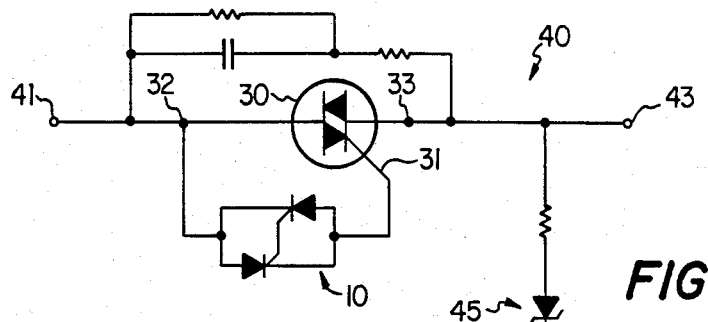
FIG. 4 is a schematic diagram of a telephone maintenance termination unit (MTU) utilizing the trigger switch of FIG. 1 and the TRIAC circuit of FIG. 3.
Figure 4:
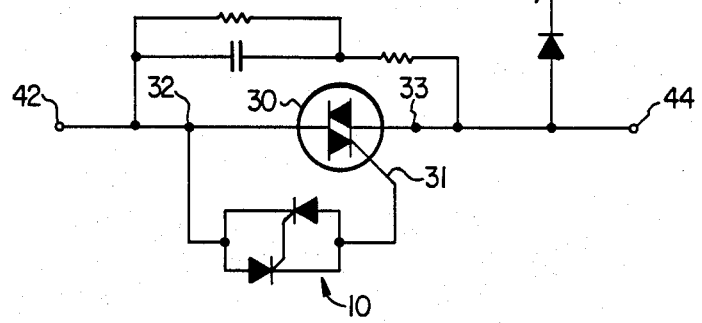

A specific embodiment of the present invention is the telephone maintenance termination unit (MTU) 40 illustrated schematically in FIG. 4. MTU 40 has terminals 41 and 42, which connect to the telephone line coming from the telephone company's central office, and terminals 43 and 44, which connect to the subscriber's telephone set. The line connected to terminal 41 is referred to as the "tip", and the line connected to terminal 42 is referred to as the "ring". An impedance termination network 45, as is well known in the art, is connected directly across terminals 43 and 44. The telephone company uses the MTU as a diagnostic circuit to test for faults or malfunctions in the telephone line servicing the subscriber. The telephone company applies electrical test signals to terminals 41 and 42 and receives a response depending upon the voltage of the test signal, the state of the MTU, and the presence of faults in the line or in the subscriber's telephone.

The MTU provided by the Western Electric Company utilizes a TRIAC similar to TRIAC 30 and a trigger circuit comprising at least two transistors, two resistors, and a rectifier bridge. The complicated circuitry provided by Western Electric is designed to trigger the TRIAC in the MTU with a low current and a low voltage in the narrow range of about 16 to 19 volts.

The present invention provides MTU 40 with TRIAC 30 and electronic trigger switch 10 as shown in FIG. 3 and described above. The circuit of FIG. 3, which utilizes trigger switch 10 having two SCRs connected in inverse parallel relationship, is connected to both the "tip" line and the "ring" line of MTU 40 at nodes 32 and 33. The simplified circuitry of the present invention, connected between nodes 32 and 33 as shown in FIG. 4, replaces the complicated circuitry provided by the Western Electric Company. The MTU of the present invention is designed to provide the same test signal response as the Western Electric MTU. However, the MTU of the present invention uses fewer circuit elements and a simpler circuit, thus providing cost savings associated with fewer components and easier circuit fabrication. The potential savings is large due to the very large number of MTUs which are to be installed on telephone lines around the world.

Figure 5:
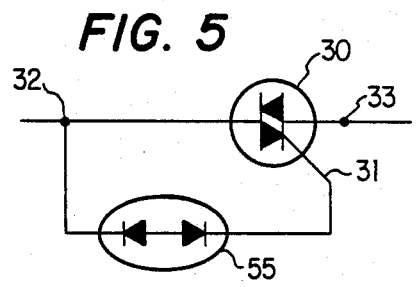
FIG. 5 is a schematic diagram of a silicon trigger switch that may be used in the MTU of FIG. 4.

Further embodiments of the present invention are shown in FIGS. 5-8, which illustrate alternative circuits that may be connected between nodes 32 and 33 of MTU 40. FIG. 5 shows a silicon trigger switch (STS) 55 that replaces the electronic trigger switch 10 in the circuit of FIG. 3. STS 55 is a two-terminal, bidirectional, diffused PNPN semiconductor device which functions with a voltage-current response similar to that of trigger switch 10. STS 55 is a simplification of MTU 40, wherein the two inverse parallel SCRs of trigger switch 10 are combined and fabricated in a single semiconductor chip having two terminals.

Figure 6:
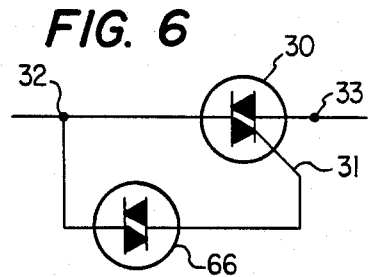
FIG. 6 is a schematic diagram of a DIAC that may be used as a trigger switch in the MTU of FIG. 4.

FIG. 6 illustrates another embodiment of MTU 40, wherein trigger switch 10 is replaced by a DIAC 66. DIAC 66 is designed specifically to have an abrupt, bilateral, low voltage breakover point so as to trigger TRIAC 30 in the same manner as trigger switch 10 or STS 55. This design further simplifies the circuit shown in FIG. 5 by replacing STS 55 with DIAC 66, which is a less complex semiconductor device.

Figure 7:
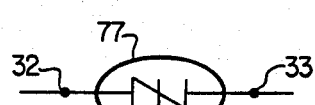
FIG. 7 is a schematic diagram of a single semiconductor device that replaces the TRIAC and trigger switch in the MTU of FIG. 4.

An embodiment of the present invention which simplifies the circuit of MTU 40 even further is shown in FIG. 7. The TRIAC 30 and the trigger switch 10, connected between nodes 32 and 33 of MTU 40, are replaced by a single, two-terminal semiconductor device, such as a SIDAC 77. SIDAC 77 has the same low voltage, low current triggering characteristics, and high holding current characteristics, as the circuits described in conjunction with FIGS. 3, 5, and 6 above. SIDAC 77 may be a more complicated semiconductor device than TRIAC 30, STS 55, or DIAC 66, but it is designed to provide fabrication and installation cost savings by combining several circuit elements into a single two-terminal device that functions effectively in a telephone system MTU. SIDAC 77 may comprise a large scale STS 55 as described below.

Figure 8:
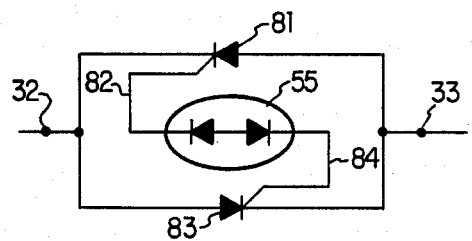
FIG. 8 is a schematic diagram of an alternative circuit that replaces the TRIAC and trigger switch of the MTU of FIG. 4.

FIG. 8 illustrates an alternative embodiment of the present invention wherein the circuit between nodes 32 and 33 of MTU 40 comprises non-sensitive gate SCRs 81 and 83 connected in inverse parallel relationship. SCRs 81 and 83 take the place of TRIAC 30 in MTU 40. Gates 82 and 84 of SCRs 81 and 83 are connected to opposite terminals of an STS 55, as shown in FIG. 8. Non-sensitive gate SCRs 81 and 83 provide the same power handling and high holding current characteristics of TRIAC 30 which they replace, and STS 55 provides low voltage, low current triggering for SCRs 81 and 83.

Figure 9:
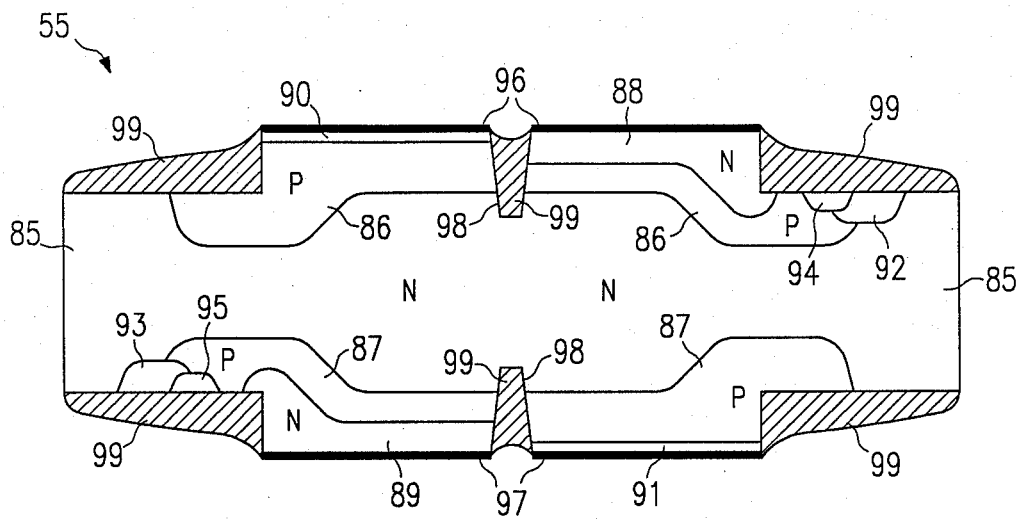
FIG. 9 is a cross-sectional diagram of the silicon trigger switch semiconductor wafer of the present invention.

Referring to FIG. 9, an enlarged cross-sectional view of the silicon trigger switch (STS) 55 of the present invention is illustrated. STS 55 is the subject of Applicants' copending U.S. application Ser. No. 811,161 filed Dec. 19, 1985, abandoned, entitled "Silicon Trigger Switch and Method of Use With a TRIAC", incorporated herein by reference. The STS 55 is a semiconductor device formed from a wafer of semiconductor material wherein layers of opposite conductivity-type material are formed in both sides of the wafer using conventional masking, diffusion, and etching techniques.

In the mesa/planar embodiment of the STS 55 illustrated in FIG. 9, the main body 85 of the STS 55 comprises N-type semiconductor material. P-type layers 86 and 87 are diffused into both sides of the body 85. N-type layers 88 and 89 are diffused into portions of the P-type layers 86 and 87, respectively. These diffusion steps yield a bilateral PNPN semiconductor device having layers 88, 86, 85, 87, and 89 of alternating opposite conductivity-type material.

The breakover voltage at the junctions between N-type layer 85 and P-type layers 86 and 87 of the STS 55 is relatively high, approximately 400 volts, depending on the rsistivity of the semiconductor wafer. The breakover voltage can be lowered to approximately 20 volts, for example, by diffusing N+ regions 92 and 93 on the PN junctions between layers 85 and 86 and layers 85 and 87, respectively. If desired, P+ diffusion regions 94 and 95 can be added to lower the breakover voltage between the P+ and N+ regions to about 8–12 volts. During this fabrication step, P+ layers 90 and 91 may be diffused to prepare the device for ohmic contact.

The N+ diffusion regions 92 and 93 function to lower the breakover voltage level and allow breakover to occur at the proper PN junction. If breakover occurs at the PN junction on the wrong side of the device, the STS 55 will not switch to the on-state, and high voltage may damage the device.

To achieve a sensitive switching device, isolator grids 98 are etched into each side of the wafer to isolate the PNPN structure from the adjacent inverse PNPN structure. The isolator grids 98 work in conjunction with the N+regions 92 and 93 to ensure that breakover occurs on the proper side of the device and at the proper breakover voltage level.

After the diffusion layers and the isolator grids have been formed as described above, the device is completed by adding metalization layers 96 and 97 on both sides of the wafer and adding glass passivation 99 to the exposed junctions of the external grid and the isolator grids 98. Since the isolator grids 98 are etched completely across the top and bottom surfaces of the device, an external connector must span isolator grid 98 and connect both halves of the metalization layer 96 to form a first main terminal, and a similar connector must connect both halves of the metalization layer 97 to form a second main terminal.

The STS 55 illustrated in FIG. 9 may be very small when it is used as a switch for a power TRIAC 30, as illustrated in FIG. 5, or as a switch for a power SCR 81, 83, as illustrated in FIG. 8. The STS 55 can also be fabricated on a large scale, measuring approximately 80 mils square, to perform the function of the SIDAC 77 illustrated in FIG. 7. The large scale STS 55 serving as SIDAC 77 replaces the STS 55 and the TRIAC 30 of FIG. 5 by performing the switching function as well as providing the capability of handling power surges of up to approximately 30 amperes full cycle or 100 amperes sub-cycle surge. Thus, the TRIAC 30 and STS 55 circuit of FIG. 5 can be replaced by a single, two-terminal semiconductor device such as the SIDAC 77, which may comprise a large scale STS 55.

In a final embodiment of the invention (not shown), the trigger switch 10 of MTU 40 can be replaced by a silicon bilateral switch (SBS) similar to the SBS type 2N4991 manufactured by the General Electric Company. However, the use of SBS 2N4991 provides only a slight simplification over the Western Electric MTU circuit. The SBS type 2N4991 is essentially two integrated circuits joined on a single semiconductor chip. Furthermore, present SBS circuits would require modification to produce the response characteristics that would enable them to function as trigger switches within an MTU.

From the foregoing description it can be seen that the present invention provides advantages related to its simplicity of structure and cost savings associated with the reduction of elements and assembly steps. Whereas the present invention has been described with respect to specific embodiments thereof, various changes and modifications may be suggested to those skilled in the art, and it is intended that the present invention encompass such changes and modifications as fall within the scope of the appended claims.

We claim:

1. A maintenance termination unit for connecting telephone tip and ring lines to a telephone subscriber's telephone set tip and ring leads, comprising:
   an impedance termination network connected across the tip and ring leads;
   a first unitary, two terminal, bidirectional semiconductor device connected between the telephone tip line and the telephone set tip lead, said first semiconductor device being self-switching between a high power conductive state and a non-conductive state;
   a second unitary, two terminal, bidirectional semiconductor device connected between the telephone ring line and the telephone set ring lead, said second semiconductor device being self-switching between a high power conductive state and a non-conductive state;
   each of said semiconductor devices being responsive to a predetermined voltage level to switch to said conductive state and thereafter requiring a holding current between said terminals for holding said semiconductor device in said conductive state; and
   each of said semiconductor devices further comprising:
      a semiconductor wafer having a body layer comprising a first conductivity-material and having top and bottom surfaces;
      a first layer comprising a second conductivity-type material formed in the top surface of said wafer;
      a second layer comprising said second conductivity-type material formed in the bottom surface of said wafer, said second layer being aligned substantially opposite said first layer;
      a third layer comprising said first conductivity-type material formed in a portion of said first layer at the top surface of said wafer;
      a fourth layer comprising said first conductivity-type material formed in a portion of said second layer at the bottom surface of said wafer;
      a first metallization layer formed across said top surface and on said third layer and said first layer to form a first switch terminal; and
      a second metallization layer formed across said bottom surface and on said fourth layer and said second layer to form a second switch terminal, such that conduction within said semiconductor device occurs between the first and second switch terminals.

2. An electronics switch for a maintenance termination unit connecting the telephone tip and ring lines to a telephone set, comprising:
   a unitary, two terminal, bidirectional semiconductor device for connecting each of the tip and ring lines to the telephone set;
   said semiconductor device being responsive to a predetermined breakover voltage to switch from a non-conductive to a high power conductive state;
   said semiconductor device requiring a predetermined holding current between said terminals for holding said semiconductor device in said conductive state; and
   said semiconductor device comprising:
      a semiconductor wafer having a body layer comprising a first conductivity-material and having top and bottom surfaces;
      a first layer comprising a second conductivity-type material formed in the top surface of said wafer;
      a second layer comprising said second conductivity-type material formed in the bottom surface of said wafer, said second layer being aligned substantially opposite said first layer;
      a third layer comprising said first conductivity-type material formed in a portion of said second layer at the bottom surface of said wafer;
      a first metallization layer formed across said top surface and on said third layer and said first layer to form a first switch terminal; and
      a second metallization layer formed across said bottom surface and on said fourth layer and said second layer to form a second switch terminal, such that conduction within said semiconductor device occurs between the first and second switch terminals.

3. The electronic switch claim 2, wherein said semiconductor device further comprises:
   a first isolator grid extending from said top surface, through said first layer, into said body layer, said first grid isolating said portion of said first layer containing said third layer from the remaining portion of said first layer and dividing said first metallization layer into two portions; and
   a second isolator grid extending from said bottom surface, through said second layer, into said body layer, said second grid isolating said portion of said second layer and dividing said second metallization layer into two portions.

4. The electronic switch of claim 3, wherein said semiconductor device further comprises:
   a fifth layer comprising heavily doped second conductivity-type material formed in the portion of said first layer not contained in said third layer and disposed between said first layer and said first metallization layer; and
   a sixth layer comprising heavily doped second conductivity-type material formed in the portion of said second layer not contained in said fourth layer and disposed between said second layer and said second metallization layer.

5. The electronic switch of claim 2, further comprising:
   a first region comprising heavily doped first conductivity-type material formed between the junction of said body layer and said portion of said first layer containing said third layer; and a second region comprising heavily doped first conductivity-type material formed between the junction of said body layer and said portion of said second layer containing said fourth layer.

6. The electronic switch of claim 5, further comprising:

a third region comprising heavily doped second conductivity-type material formed between the junction of said first layer and said first region; and a fourth region comprising heavily doped second conductivity-type material formed between the junction of said second layer and said second region.

* * * * *